United States Patent
Yli-Taipalus

(10) Patent No.: US 12,446,165 B2
(45) Date of Patent: Oct. 14, 2025

(54) ELECTRONIC DEVICE AND METHOD FOR FORMING ELECTRONIC DEVICE

(71) Applicant: EPEC OY, Seinäjoki (FI)

(72) Inventor: Tuomo Yli-Taipalus, Seinäjoki (FI)

(73) Assignee: EPEC OY, Seinäjoki (FI)

( * ) Notice: Subject to any disclaimer, the term of this patent is extended or adjusted under 35 U.S.C. 154(b) by 208 days.

(21) Appl. No.: 18/012,859

(22) PCT Filed: Jun. 22, 2021

(86) PCT No.: PCT/FI2021/050476
§ 371 (c)(1),
(2) Date: Dec. 23, 2022

(87) PCT Pub. No.: WO2021/260270
PCT Pub. Date: Dec. 30, 2021

(65) Prior Publication Data
US 2023/0300995 A1    Sep. 21, 2023

(30) Foreign Application Priority Data

Jun. 25, 2020  (FI) .................................. 20205672

(51) Int. Cl.
*H05K 5/00* (2025.01)
*H05K 1/02* (2006.01)

(52) U.S. Cl.
CPC ......... *H05K 5/0056* (2013.01); *H05K 1/0278* (2013.01); *H05K 2201/056* (2013.01)

(58) Field of Classification Search
CPC ............... H05K 5/0056; H05K 1/0278; H05K 2201/056

USPC ......................................................... 361/749
See application file for complete search history.

(56) References Cited

U.S. PATENT DOCUMENTS

| | | | |
|---|---|---|---|
| 5,754,409 A | 5/1998 | Smith | |
| 2005/0190531 A1 | 9/2005 | Gall et al. | |
| 2007/0126125 A1 | 6/2007 | Rapport et al. | |
| 2009/0166065 A1 | 7/2009 | Clayton et al. | |
| 2013/0155653 A1 | 6/2013 | Kim et al. | |
| 2015/0109544 A1* | 4/2015 | Yeo | H10K 59/00 349/12 |
| 2017/0105290 A1* | 4/2017 | Kim | H05K 1/148 |
| 2019/0354145 A1 | 11/2019 | Kim et al. | |
| 2021/0197493 A1* | 7/2021 | Mark | B29C 64/141 |

FOREIGN PATENT DOCUMENTS

| | | | | |
|---|---|---|---|---|
| CN | 103680319 A | * | 3/2014 | ....... G02F 1/133308 |
| DE | 102014110728 A1 | * | 2/2015 | ............... H05K 1/14 |

OTHER PUBLICATIONS

Mar. 27, 2024 Search Report issued in European Patent Application No. 21828059.2, pp. 1-7.

(Continued)

*Primary Examiner* — Andargie M Aychillhum
(74) *Attorney, Agent, or Firm* — Nixon & Vanderhye PC

(57) ABSTRACT

In the disclosed solution, an electronic device (1) includes a printed circuit board (4) having a flexible part (4c), and a support part (5). The printed circuit board is bent by making use of the flexible part (4c) so that at least a part of the printed circuit board is over a second part of the printed circuit board (4). The support part (5) is adapted to support the flexible part (4c).

21 Claims, 2 Drawing Sheets

(56) References Cited

OTHER PUBLICATIONS

Office Action for FI Application No. 2201134 dated Aug. 23, 2022, 5 pages.
Search Report for FI Application No. 20205672 dated Jan. 19, 2021, 1 page.
International Search Report and Written Opinion of the ISA for PCT/FI2021/050476 dated Sep. 28, 2021, 13 pages.

* cited by examiner

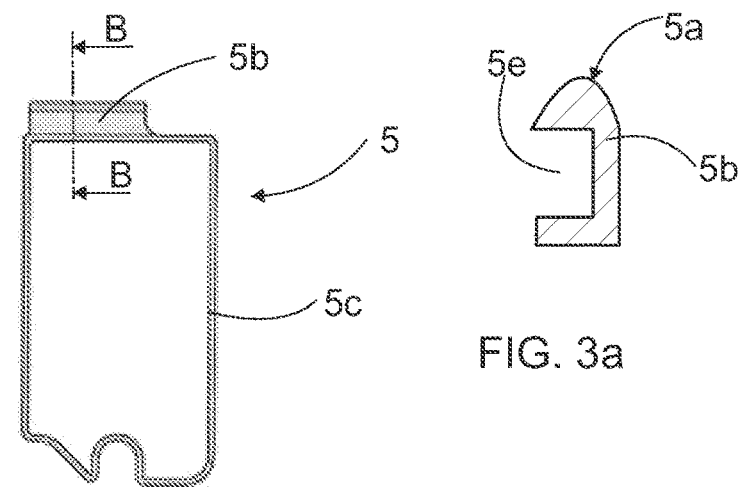
FIG. 3a
FIG. 3
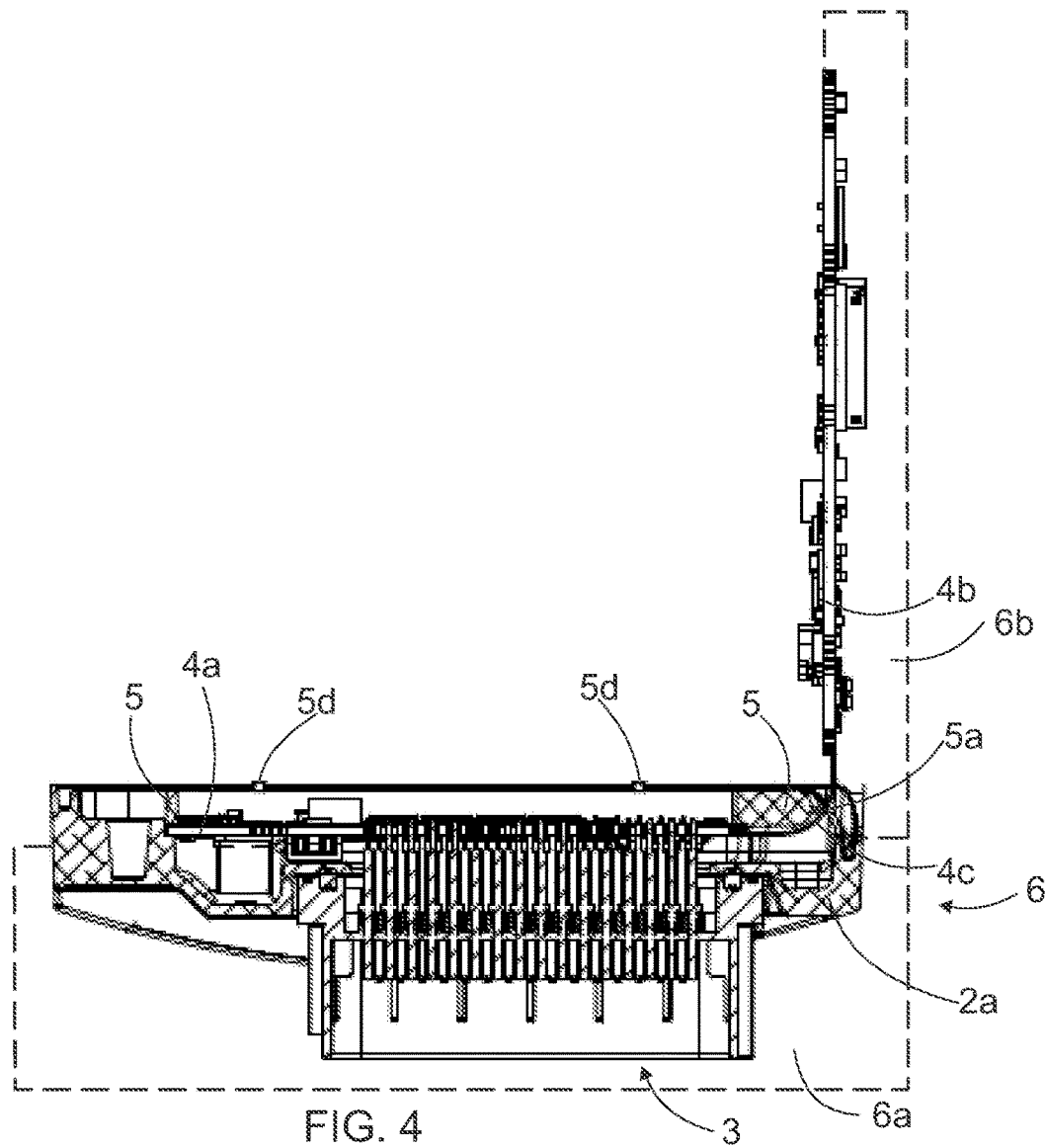
FIG. 4

ELECTRONIC DEVICE AND METHOD FOR FORMING ELECTRONIC DEVICE

CROSS-REFERENCE TO RELATED APPLICATIONS

This application is the U.S. national phase of International Application No. PCT/FI2021/050476 filed Jun. 22, 2021 which designated the U.S. and claims priority to FI patent application No. 20205672 filed Jun. 25, 2020, the entire contents of each of which are hereby incorporated by reference.

BACKGROUND OF THE INVENTION

The invention relates to an electronic device and a method for forming it.

In work machines, for example, and other uses that are challenging from the viewpoint of the surrounding conditions very high requirements are placed for the durability of electronic devices.

BRIEF DESCRIPTION OF THE INVENTION

An object of the invention is thus to provide a novel electronic device and a method for forming it. The solution according to the invention is characterized by what is disclosed in the independent claims. Some embodiments of the invention are disclosed in the dependent claims.

In the disclosed solution, the electronic device includes a printed circuit board having a flexible part, and a support part. The printed circuit board is bent by making use of the flexible part so that at least one part of the printed circuit board is over a second part of the printed circuit board. The support part is adapted to support the flexible part. This way, the printed circuit board can be adapted in such a way that the space it requires is fairly small. During manufacture of the electronic device, the support part guarantees that the bending of the printed circuit board takes place controllably. Further, when an electronic device is being used, the support part prevents the flexible part from oscillation and thereby prevents the flexible part from breaking, adding to the durability of the electronic device.

According to an embodiment, the support part has a curved surface adapted against the surface of the flexible part. This way, it is possible to support the flexible part effectively during both the manufacture and use.

According to an embodiment, the support part forms a periphery adapted to support the superimposed parts of the printed circuit board, which are adapted on its different sides. In such a case, a printed circuit board can be completely supported in a most effective manner. So, the same support part takes care of two functions, that is, the support part supports both the flexible part and the superimposed parts of the printed circuit board. A printed circuit board can thus be firmly and reliably supported by a simple and light-weight structure. The printed circuit board can be carefully supported to an enclosure.

According to an embodiment, the support part is plastic. The support part therefore provides support and insulates effectively, and is reasonably light and rigid.

According to an embodiment, the support part has a part which settles against the flexible part of the printed circuit board and whose body is formed lightweight. For example, it is possible to form a recess or recesses in the body, or the body may be provided with a ribbing. The body of the support part can be made firm in this manner, but it is nevertheless relatively light and advantageous to implement from the casting technique viewpoint.

According to an embodiment, the support part has formed parts and the printed circuit board has corresponding formed parts so that the support part guides the part of the printed circuit board in place and keeps it in place. In this solution, a printed circuit board can be guided precisely in its place and kept reliably in the desired position.

According to an embodiment, the printed circuit board has at least two rigid parts, interconnected by a flexible part, and which rigid parts are placed one on the other.

According to an embodiment, the electronic device comprises an enclosure inside which the printed circuit board and support part are adapted. The assembly of the electronic device may be carried out by adapting a printed circuit board to a part of the enclosure, placing the part of the enclosure and the printed circuit board in an installation jig, adapting a support part in connection with the printed circuit board, and turning the part of the printed circuit board over its second part with the installation jig. This way, the electronic device can remarkably well withstand challenging conditions, and its assembly may be implemented simply and reliably.

BRIEF DESCRIPTION OF FIGURES

The invention is now described in closer detail in connection with some embodiments and with reference to the accompanying drawings, in which:

FIG. 3 is a schematic top view of a support part;

FIG. 3a shows a part of the support part of FIG. 3, in cross section along line B-B of FIG. 3; and FIG. 4 is a schematic cross-sectional side view of an assembly stage of the electronic device.

DETAILED DESCRIPTION

Figure 1:
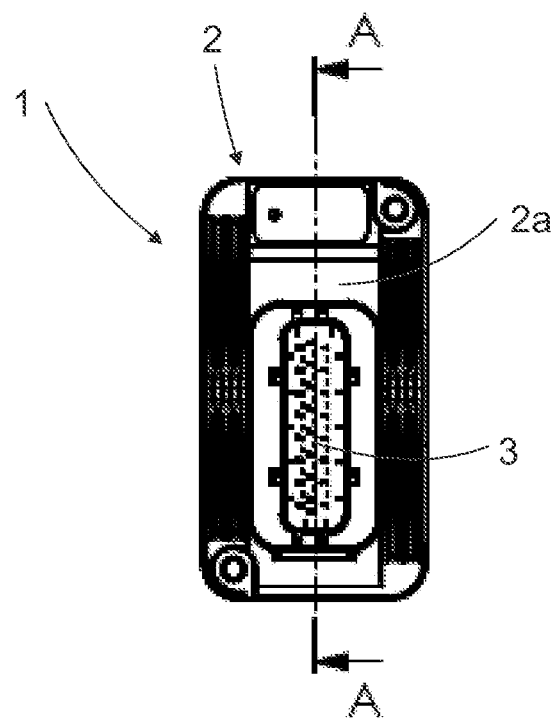
FIG. 1 is a schematic top view of an electronic device.

FIG. 1 shows an electronic device 1. In FIG. 1, an upper part 2a of an enclosure 2 of the electronic device 1 is shown. Further, FIG. 1 shows a connector 3 in the electronic device 1.

Figure 2:
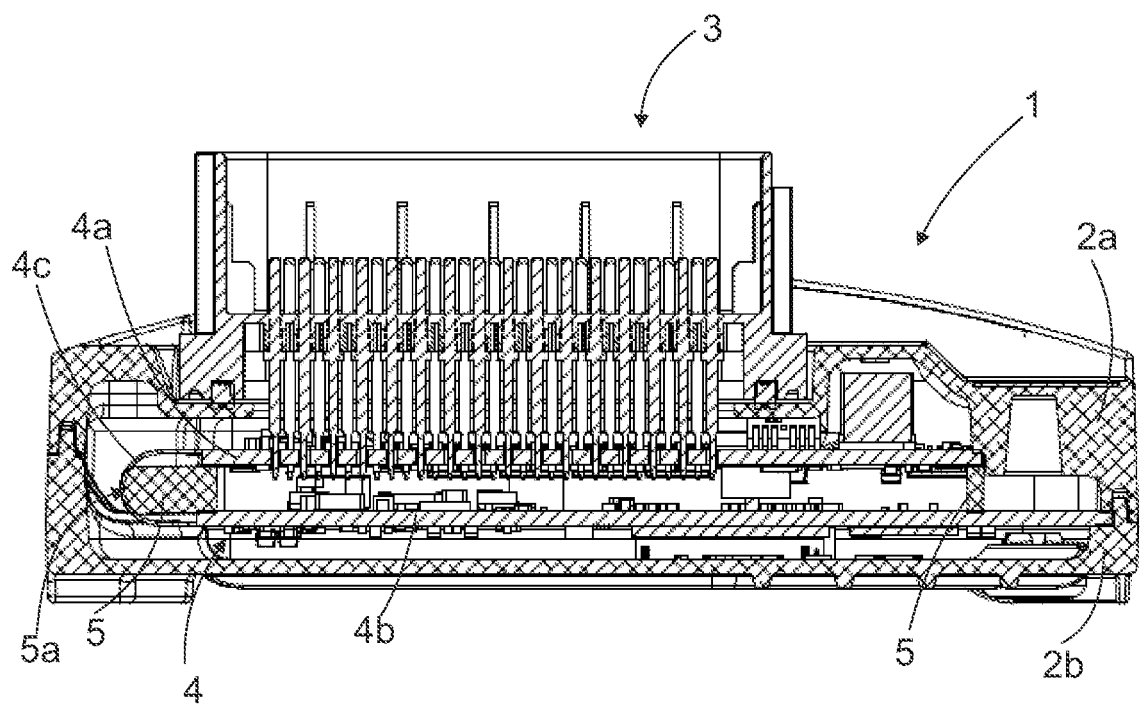
FIG. 2 is a schematic side view of the electronic device of FIG. 1, and in cross section along the cutting line A-A shown in FIG. 1.

FIG. 2 is a side view of the electronic device 1 and in cross section along the cutting line A-A shown in FIG. 1. The connector 3 is fastened to the upper part 2a of the enclosure 2. The fastening of the connector 3 to the enclosure 2 may be accomplished with a screw-fastening, for example. The upper part 2a and lower part 2b of the enclosure 2 are also fastened to each other. This fastening, too, may be accomplished with a screw-fastening, for example.

Adapted inside the enclosure 2 is a printed circuit board 4. The pins of the connector 3 are soldered to the printed circuit board 4. In the embodiment of FIG. 2, the printed circuit board 4 has two rigid parts, that is, an upper rigid part 4a and lower rigid part 4b. The pins 3 of the connector 3 are soldered to the upper rigid part 4a of the printed circuit board 4.

The printed circuit board 4 further has a flexible part 4c interconnecting the rigid parts 4a and 4b. The printed circuit board 4 is bent, by making use of the flexible part 4c, so that the rigid parts 4a and 4b are adapted one on the other, that is, the upper rigid part 4a is at least partly over the lower rigid part 4b. If so desired, the entire printed circuit board 4 may also be formed flexible, whereby a part of the printed circuit board 4 may be bent over a second part of the printed circuit board 4.

The electronic device 1 further has a support part 5. The support part 5 is adapted between the upper rigid part 4a and lower rigid part 4b of the printed circuit board 4. The support part 5 has a curved surface 5a adapted against the surface of the flexible part 4c of the printed circuit board 4.

A support part 5 is shown in FIG. 3. The support part 5 has a body 5b on which the curved surface 5a is formed. The width of the body 5b may be equal to the width of the flexible part 4c. The width of the flexible part 4c may be smaller than the width of the rigid parts 4a and 4b.

The support part 5 has an open middle section which means that the support part 5 has a periphery 5c in addition to the body 5b. When the support part 5 is adapted between the rigid parts 4a and 4b, the periphery 5c supports both rigid parts 4a and 4b at their edges. According to an embodiment, the periphery 5c is adapted to support the superimposed parts of the printed circuit board 4 at their edges, only. The width of the body 5b of the support part 5 may be smaller than the width of the support part 5 at the periphery 5c.

The support part 5 may be formed of a plastic, such as polyethene PE of polypropene PP. Because the support part 5 has a part open at the centre, that is, it has the periphery 5c, its structure is simple and light overall. The support part 5 is relatively easy and simple to form by injection moulding, for example. The body 5b of the support part 5 may be formed lightened. It is possible to form a recess 5e or recesses, for example, in the body 5b. FIG. 3a illustrates a body 5b provided with a recess 5e. The body 5b may be formed lightened, for example, by also providing it with a ribbing. When the body 5b of the support part 5 is formed lightened, it can on the one hand be made firm, but it is nevertheless relatively light and advantageous to implement with the casting technique in mind. This way, the support part 5 is entirely durable but lightweight by structure. Further, when using injection moulding, for example, due to the lightening it is possible to implement cooling for the part so that additional stresses may be avoided in the end product.

The assembly of the electronic device 1 may be implemented in the following manner, for example. The connector 3 is placed in a connector jig. The upper part 2a of the enclosure 2 is placed over the connector 3 in the connector jig. The connector 3 and the upper part 2a of the enclosure 2 are fastened to each other with a screw fastening, for example.

The printed circuit board 4 is placed in a solder pallet. The upper part 2a of the enclosure 2, having the connector 3 fixed thereto, is set in the solder pallet over the printed circuit board 4. The upper part 2a of the enclosure 2 is placed over the upper rigid part 4a of the printed circuit board 4 so that the connector 3 pins go through the upper rigid part 4a of the printed circuit board 4. The upper part 2a of the enclosure 2 and the printed circuit board 4 are locked to the solder pallet, and the connector 3 and printed circuit board 4 are soldered to each other in a soldering machine, for example.

Following this, the assembly is placed in the solder pallet to an assembly jig 6. The assembly jig 6 has, as schematically illustrated with a broken line in FIG. 4, a support part 6a of the assembly jig and an installation part 6b of the assembly jig. The installation part 6b of the assembly jig is pivotably fastened to the support part 6a of the assembly jig.

The upper part 2a of the enclosure 2, connector 3, and upper rigid part 4a of the printed circuit board 4 are placed to the support part 6a of the assembly jig, and the lower rigid part 4b of the printed circuit board 4 is placed to the installation part 6b of the assembly jig. The locks of the solder pallet are opened, and the solder pallet is lifted off.

The support part 5 between the rigid parts 4a and 4b of the printed circuit board 4 is placed over the upper rigid part 4a of the printed circuit board 4. The support part 5 rests by its outer edges on the inner edges of the upper part 2a of the enclosure 2 and thus settles precisely in place.

Following this, the lower rigid part 4b of the printed circuit board 4 is turned with the installation part 6b of the assembly jig over the upper rigid part 4a of the printed circuit board 4, as illustrated in FIG. 4. During the bending in question, the flexible part 4c of the printed circuit board 4 is supported by the support part 5 so that the flexible part 4c is against the curved surface 5a of the support part 5.

The support part has formed parts and the printed circuit board 4 has corresponding formed parts so that the support part 5 guides the lower rigid part 4b of the printed circuit board 4 in place and keeps it in place in contact with the support part 5. In the embodiment of FIG. 4, the formed parts of the support part 5 are pegs 5d. Instead of pegs 5d, the formed parts of the support part may also be other protrusions. When the formed parts of the support part 5 are pegs or other protrusions, the corresponding formed parts on the lower rigid part 4b of the printed circuit board 4 may be openings, grooves, or other recesses, for example. The formed parts may also be arranged the other way round, whereby the support part 5 has recesses and the printed circuit board 4 has protrusions.

Once the lower rigid part 4b of the printed circuit board 4 is adapted in place, the assembly may be released from the installation jig 6. The lower part 2b of the enclosure 2 is adapted in connection with the upper part 2a of the enclosure 2. The lower part 2b of the enclosure 2 is fastened in connection with the upper part 2a of the enclosure 2 by a screw fastening, for example. The support part 5 is dimensioned so that the upper part 4a of the printed circuit board 4 is tightly squeezed against the upper part 2a of the enclosure 2, and correspondingly the lower part 4b of the printed circuit board is tightly squeezed against the lower part 2b of the enclosure 2. This way, the electronic device 1 is overall rigid and solid and is able to withstand extremely well even severe environmental conditions.

Those skilled in the art will find it obvious that, as technology advances, the basic idea of the invention may be implemented in many different ways. The invention and its embodiments are thus not restricted to the examples described above but may vary within the scope of the claims.

The invention claimed is:

1. An electronic device, comprising
a printed circuit board having a flexible part so that the printed circuit board is bent by making use of the flexible part so that at least a part of the printed circuit board is over a second part of the printed circuit board, and
a support part configured to support the flexible part,
the support part forming a periphery, wherein the support part has an open middle section, and
the support part being configured to support the superimposed parts of the printed circuit board at their edges,
wherein the support part has a curved surface provided against the surface of the flexible part and configured to prevent the flexible part from vibration.

2. The electronic device as claimed in claim 1, wherein the support part is plastic.

3. The electronic device as claimed in claim 2, wherein the support part has a part which settles against the flexible part of the printed circuit board and whose body is formed lightened.

4. The electronic device as claimed in claim 1, wherein the support part has a part which settles against the flexible part of the printed circuit board and whose body is formed lightened.

5. The electronic device as claimed in claim 1, wherein the support part has formed parts and the printed circuit board has corresponding formed parts so that the support part guides the part of the printed circuit board in place and keeps it in place.

6. The electronic device as claimed in claim 1, wherein the printed circuit board has at least two rigid parts, interconnected by a flexible part, and which rigid parts are placed superimposed.

7. The electronic device as claimed in claim 1, wherein the electronic device comprises an enclosure inside which the printed circuit board and support part are provided.

8. The electronic device as claimed in claim 1, wherein the support part has a body on which the curved surface is formed.

9. The electronic device as claimed in claim 8, wherein a width of body of the support part is equal to a width of the flexible part.

10. The electronic device as claimed in claim 8, wherein the flexible part is bent so that the flexible part has a curved surface.

11. The electronic device as claimed in claim 10, wherein the support part and the flexible part directly physically contact one another along the entirety of the curved surface of the support part.

12. The electronic device as claimed in claim 11, wherein a portion of the curved surface of the flexible part is spaced apart from an upper surface of the body of the support part.

13. The electronic device as claimed in claim 1, wherein the support part has a lightened part which settles against the flexible part of the printed circuit board and whose body includes ribs that lighten the lightened part.

14. A method for forming an electronic device, the method comprising:
providing a printed circuit board having a flexible part,
providing, in connection with the flexible part of the printed circuit board, a support part forming a periphery, wherein the support part has an open middle section,
bending the printed circuit board so that at least a part of the printed circuit board settles over a second part of the printed circuit board,
supporting the flexible part with a support part during bending, wherein the support part has a curved surface provided against the surface of the flexible part and preventing the flexible part from vibration, and
placing the parts of the printed circuit board which are placed superimposed on different sides of the periphery so that the support part supports the superimposed parts of the printed circuit board at their edges.

15. The method as claimed in claim 14, wherein the support part has formed parts and the printed circuit board has corresponding formed parts so that the support part guides the part of the printed circuit board in place.

16. The method as claimed in claim 14, wherein the printed circuit board has at least two rigid parts, interconnected by a flexible part, and which rigid parts are placed superimposed.

17. The method as claimed in claim 14, wherein the printed circuit board is provided to a part of an enclosure, the part of the enclosure and the printed circuit board are placed in an installation jig, a support part is provided in connection with the printed circuit board, and the part of the printed circuit board in turned over its second part with the installation jig.

18. The method as claimed in claim 14, wherein the support part has a body on which the curved surface is formed.

19. The method as claimed in claim 18, wherein the flexible part is bent so that the flexible part has a curved surface.

20. The method as claimed in claim 19, wherein the support part and the flexible part directly physically contact one another along the entirety of the curved surface of the support part.

21. The method as claimed in claim 20, wherein a portion of the curved surface of the flexible part is spaced apart from an upper surface of the body of the support part.

* * * * *